United States Patent
Houston

(10) Patent No.: US 6,308,312 B1
(45) Date of Patent: Oct. 23, 2001

(54) SYSTEM AND METHOD FOR CONTROLLING LEAKAGE CURRENT IN AN INTEGRATED CIRCUIT USING CURRENT LIMITING DEVICES

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/211,654

(22) Filed: Dec. 15, 1998

Related U.S. Application Data

(60) Provisional application No. 60/068,303, filed on Dec. 19, 1997.

(51) Int. Cl.[7] ............................................. G06F 17/50
(52) U.S. Cl. ............................................................ 716/17
(58) Field of Search ................................. 326/34; 716/17

(56) References Cited

U.S. PATENT DOCUMENTS 5,821,769 * 10/1998 Douseki .................................. 326/34

* cited by examiner

Primary Examiner—Matthew Smith
(74) Attorney, Agent, or Firm—Gerald E. Laws; W. James Brady, III; Frederick J. Telecky, Jr.

(57) ABSTRACT

A circuit 10 is provided that comprises a source resistance transistor 12 connected to a common node 14. A word line driver circuit 18 receives current if it is the word line driver selected from the $V_{DD}$ supply voltage through the source resistance transistor 12. The gate of source resistance transistor 12 is connected to a bond pad 22 which can be alternatively connected to the $V_{DD}$ supply voltage through a bond pad 24 or to ground potential through a bond pad 26. The effective threshold voltage of a transistor 18 within driver 16 can be adjusted depending upon how the gate of transistor 12 is connected. In this manner, a circuit can be adjusted to compensate for process variation or to be more optimum for a selected application by adjustment of the effective threshold voltage of selected transistors.

7 Claims, 3 Drawing Sheets

SYSTEM AND METHOD FOR CONTROLLING LEAKAGE CURRENT IN AN INTEGRATED CIRCUIT USING CURRENT LIMITING DEVICES

This application claims priority under 35 USC § 119(e)(1) of Provisional Application Number 60/068,303, filed Dec. 19, 1997.

TECHNICAL FIELD OF THE INVENTION

This invention relates in general to the field of electronic systems, and more particularly, to an improved system and method for controlling leakage current in an integrated electronic device using current limiting devices.

BACKGROUND OF THE INVENTION

Integrated circuit devices must be designed so that they provide enough current to accomplish the tasks logically assigned to them and they must accomplish these tasks without drawing an inordinate amount of power. There is a direct design tradeoff between drive current and leakage current in the design of an electronic system. A device such as a transistor that is designed to provide a fast switching operation and designed to provide a large amount of current will also unfortunately result in an unacceptable amount of leakage current when the device is turned off. This leakage current can negatively affect the power consumption of the entire device.

To address the leakage current, prior techniques have used series resistors and current limiting devices in the current path of such transistors. The problem is that these devices and other techniques are not always necessary. Transistors that have excessively high leakage current do not consistently appear. The characteristics of these transistors are dependent upon process variations and sometimes the operating environments in which the transistors are placed. In cases where the transistors do not have an excessively large leakage currents or for applications where such leakage current is not of primary concern, the presence of the current limiting devices unnecessarily impedes the speed and operational capabilities in the integrated system.

SUMMARY OF THE INVENTION

Accordingly, a need has arisen for a system and method of addressing leakage current within integrated devices that is applicable where needed but does not impede the operation of devices that do not demonstrate unacceptable leakage current.

According to the teachings of the present invention, a system and method for controlling leakage current are provided that substantially eliminate or reduce problems associated with prior techniques and systems. According to one embodiment of the present invention, a method for controlling leakage current in an integrated circuit is provided that determines whether a current carrying device within the integrated circuit demonstrates an unacceptable level of leakage current. Responsive to that determination, a control node within the circuit is then selectively connected to a supply voltage such as ground potential or $V_{DD}$ to adjust the effective threshold voltage of the subject device.

According to one specific embodiment of the present invention, a source resistance transistor in series with a current carrying device has its control gate coupled to either ground potential or the supply voltage depending upon the inherent threshold voltage or leakage of the current carrying device. If the source resistance transistor is turned to its high conduction state, the threshold voltage of the current carrying device is effectively unchanged. If the source resistance transistor is put in a low conduction state, the effective threshold voltage of the current carrying device will be changed to a level which will reduce the amount of leakage current -trough the current carrying device.

According to an alternate embodiment of the present invention, a back-gate contact to a current carrying device is available for selective connection to a supply voltage such as ground potential or $V_{DD}$. The back-gate contact may comprise for example, a contact to a buried gate, a well contact or a substrate bias contact. According to the inherent characteristics of the device and the application, the back-gate contact can be coupled to a supply voltage that will relatively increase or decrease the threshold voltage of the current carrying device.

BRIEF DESCRIPTION OF THE DRAWINGS

A more completed understanding of the present invention and the advantages thereof may be acquired by referring to the accompanying FIGS. In which like reference numbers indicate like features and wherein.

DETAILED DESCRIPTION OF THE INVENTION

Figures 1, 2:
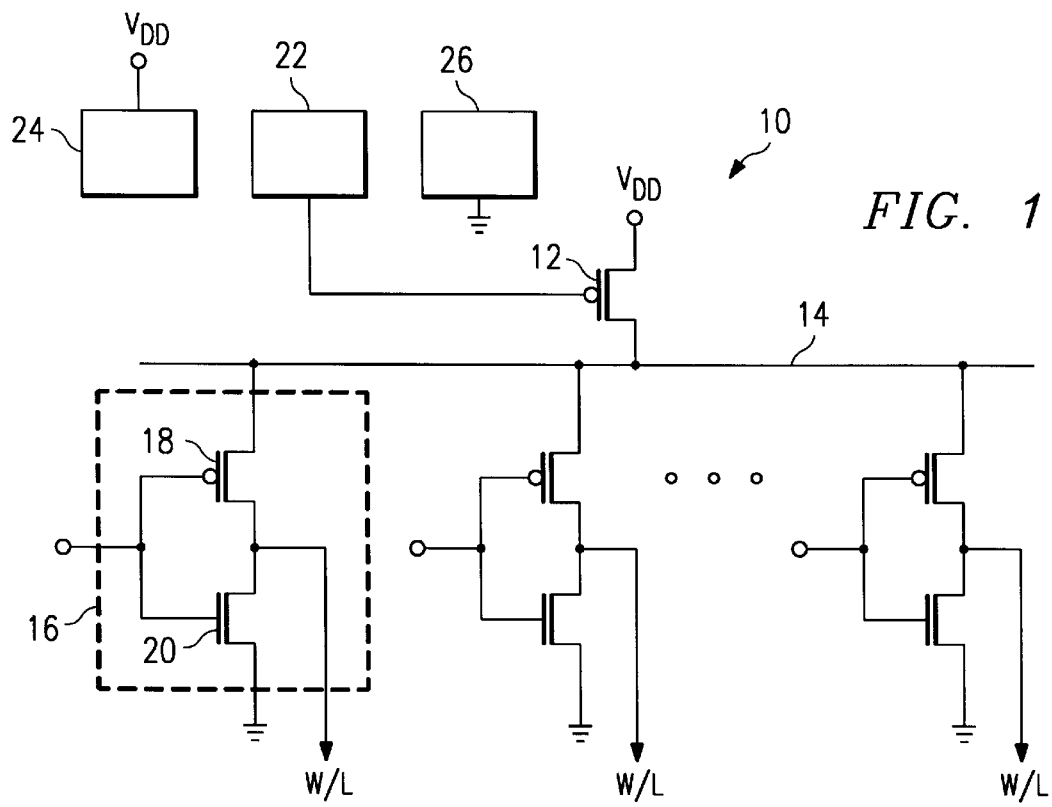
FIG. 1 is a schematic illustration of an integrated circuit constructed using the systems and techniques of the present invention.
FIG. 2 is a schematic illustration of an integrated circuit constructed using systems and techniques of the present invention.

FIG. 1 illustrates a circuit 10 that comprises a p-channel source resistance transistor 12 connected between a $V_{DD}$ supply voltage and a common node 14. The common node 14 is connected to a plurality of word line driver circuits. An exemplary word line driver circuit 16 comprises a p-channel transistor 18 and a n-channel transistor 20. The source of p-channel transistor 18 is connected to the common node 14. The drain of a p-channel transistor is connected to the drain of n-channel transistor 20. The source of n-channel transistor 20 is connected to ground potential. The gates of transistors 18 and 20 are connected together and receive an input control signal. In operation, word line driver 16 receives the input control signal and provides a drive current for a word line connected to the node between transistors 18 and 20 if the input control signal is low. If the input control signal is high, the word line connected to circuit 16 is isolated from common node 14.

In operation, only one of the word line driver circuits in the array connected to common node 14 will be active at any one time. As such, one of the p-channel transistors within the word line driver circuits will be carrying the full amount of current supplied from the $V_{DD}$ supply voltage through the source resistance transistor 12. The remaining p-channel transistors within the non-selected word line driver circuits are supposed to isolate the word lines connected to their respective word line driver circuits from the common node 14. However, in actuality, the processes used to create the p-channel transistors such as p-channel transistor 18 are imperfect and these transistors exhibit leakage currents even when the signals connected to the gates of these transistors are high.

According to the teachings of the present invention, the integrated circuit comprising circuit 10 or associated test structures can be tested after they have been partially or completely constructed to determine the amount of leakage current through the word line driver circuits such as circuit 16. If this leakage current is too large for the intended application, the threshold voltage of the p-channel transistors such as transistor 18 within each of the word line driver circuits is too low. The threshold voltage can be effectively adjusted by connecting the gate of transistor 12 to the $V_{DD}$ supply voltage. If the threshold voltages of p-channel devices such as transistor 18 are not too low and the transistors do not exhibit an inordinate amount of leakage current for the intended application, the gate of transistor 12 can be strapped to ground potential effectively shorting the common node 14 to the $V_{DD}$ supply voltage.

As shown in FIG. 1, the gate of transistor 12 can be connected to a bond pad 22. The $V_{DD}$ supply voltage can similarly be connected to a bond pad 24 and the ground potential can be connected to a bond pad 26. The characterization of the leakage currents within the p-channel transistor such as transistor 18 can be made after the integrated circuit is completed or it can be made during the fabrication of the device using in-line testing or probes. If the determination is made prior to completion of the integrated circuit, the connection between the conductive regions connected to bond pad 22 and the conductive regions connected to either bond pad 24 or 26 can be made within the integrated circuit through the use of alternate mask layouts and conductive layers formed using the alternate mask layers without the use of any bond pads whatsoever. Alternatively, the connection of bond pad 22 to either bond pad 24 or bond pad 26 can be performed when circuit 10 and the integrated circuit die on which it resides are placed in a package. This can be done directly by bonding one pad to the other or through the package or circuit board connection. Alternate packages or circuit boards can be used depending upon whether or not the desired connection is to ground or to the $V_{DD}$ supply voltage.

According to still another alternate embodiment of the present invention, the bond pad 22 could be electrically routed to an external pin of a package. In this manner, access to the gates of the current limiting devices within the integrated circuit can be afforded to systems external to circuit 10. In this manner, the circuit would have effectively two or more modes of operation depending upon whether or not the pin connected to bond pad 22 was connected to the $V_{DD}$ supply voltage ground potential or some other supply voltage. This connection could be a permanent connection based on testing of the integrated device. Alternatively, however, the ability to change this connection could be used to provide for both a low power, lower performance mode and a high power, higher performance mode of a single device. For example, in the context of circuit 10 shown in FIG. 1, by lowering the current carrying capacity of transistor 18 and all the remaining p-channel transistors within the word line drivers through the use of the source resistance transistor 12, the speed of the memory system is effectively decreased. This is due to the fact that less current will be provided to the word line. This drop in speed is accompanied by a related drop in leakage current. Accordingly, in the context of a battery powered application for example, a low power, lower performance mode of operation might be very useful. However, if the same device were connected to a less limited power source, the same system could then go into a mode of operation where leakage current is not as great of a concern. In this mode of operation, the gate of the current limiting device 12 would be connected to ground potential which would accordingly allow for a higher amount of current to be passed to each word one within the memory system. With the higher drive current, the memory system could accomplish higher switching rates and lower access times to data stored within the memory system.

It should be understood that ground potential can be thought of as a supply voltage. It should also be understood that various supply voltage levels and numbers of levels may be used without departing from the present invention. The description of two levels comprising $V_{DD}$ and ground are presented solely for purposes of teaching the present invention and not by way of limitation.

According to an alternate embodiment of the present invention, the ability to switch within the two modes of operation could be accomplished on the same chip as integrated circuit 10. In this embodiment, the system in which circuit 10 resides could include systems able to evaluate the performance of the integrated system and to adjust the connections of the current limiting devices within the circuit such as transistor 12 responsive to such evaluations. For example, signals could be passed through delay circuits and compared to a predetermined number of clock transitions with the circuit placed in a low power, low performance mode of operation. If the signal was able to pass through the delay circuit in time, the performance of the overall system would be deemed acceptable. However, if the signal was not able to pass through the delay circuit in time, the circuit could adjust to a more higher performance mode of operation by changing the connections of the control points such as the gate of source resistance transistor 12 to provide more current and a corresponding higher level of performance. Thus, selection of the control node voltage can be based on circuit speed as well as leakage current.

According to the present invention, an integrated circuit can undergo a partial fabrication and can then be tested using in-line testing or various process monitors. Alternatively, a particular application for the circuit can be selected before the fabrication of the circuit is completed. Responsive to the process monitor results or the application requirements, the threshold voltage of various devices within the circuit can be adjusted using a selected interconnect pattern. The fabrication of the integrated circuit can then be completed using the selected interconnect pattern to effect the threshold voltage changes.

Alternatively, the fabrication of the integrated circuit can be completed. Process monitor testing or application requirements can also be determined. In addition, the completed integrated circuit can be subjected to circuit tests. Using these inputs, the control nodes associated with the threshold voltage adjustment devices can be connected through packaging or board level interconnection. In this manner, the threshold voltages can be adjusted in response to variability of the processes used to form the integrated circuit or in response to specific application requirements.

Further, the entire integrated circuit can be fabricated and placed in an integrated system where the remainder of the system surrounding the integrated circuit has access to and has the ability to adjust the threshold voltages of selected devices by manipulation of inputs and outputs to the integrated circuit. In this manner, a complete system can adjust itself to measured process variations or adjust dynamically to changes in applications or operating conditions.

Source resistance transistor 12 is designed so that even if its gate is coupled to the $V_{DD}$ supply voltage, current will still pass through transistor 12 from the $V_{DD}$ supply voltage to common node 14. In other words, even if source resistance transistor 12 is in its low conduction state, it will still conduct a sufficient amount of current to control node 14 to supply the word line driver circuits such as circuit 16. This can be accomplished by choice of the control voltage, and by design of the current limiting transistor. This form of a transistor is referred to as an accumulation mode transistor and can be constructed by introducing dopants into the channel region of the transistor that are of the same species as the dopants used to form the source and drain regions of the transistor. An amount of dopant is introduced into the channel region to provide for the required amount of conductivity through the channel region even if the gate of the transistor is inactive.

According to one embodiment of the present invention, the source resistance transistor is placed in parallel with another conduction path such as a resistor, a diode, or another transistor. Alternatively, more than one source resistance transistor may be connected in parallel, optionally selectively connected to different control voltages to give increased options for adjustment of the effective threshold voltage of the current carrying transistor. For example, such a current limiting combination might comprise a source resistance transistor connected in parallel with a (1) resistor; (2) a diode; (3) an n-channel transistor with its gate connected to $V_{DD}$; or (4) a p-channel transistor with its gate connected to ground potential. Alternatively, the current limiting combination may comprise multiple controllable source resistance transistors the gates of which may be independently connected to different supply voltages. These multiple parallel controllable transistors may also be connected in parallel with resistors, diodes, or other suitable devices.

FIG. 2 is a schematic illustration of a circuit 30 that includes an n-channel source resistance transistor 32. Circuit 30 comprises a series connection of two inverters indicated generally at 34 and 36. Inverter 34 comprises a p-channel transistor 38 and an n-channel transistor 40. Transistors 38 and 40 receive an input signal at their gates. The source of transistor 38 is connected to the $V_{DD}$ supply voltage. The drain of transistor 38 is connected to the drain of transistor 40. The source of transistor 40 is connected to ground potential. The drain of transistor 40 and the drain of transistor 38 are connected to the gates of a p-channel transistor 42 and an n-channel transistor 44. The source of transistor 42 is connected to the $V_{DD}$ supply voltage. The drain of transistor 42 is connected to the drain of transistor 44. An output signal is generated from the drain of transistor 42 and the drain of transistor 44. The source of transistor 44 is connected to the drain of a source resistance transistor 32. The source of transistor 32 is connected to ground potential. The gate of transistor 32 is connected to a bond pad 46. Bond pad 48 is connected to the $V_{DD}$ supply voltage. Bond pad 50 is connected to ground potential.

In modern electronic devices, logic stages are often connected in series such as inverter stages 34 and 36 shown in FIG. 2. Stage 34 receives the input signal and generates the inverse of the input signal to be passed on to stage 36. Stage 36 inverts the received signal and generates the output signal which is effectively an amplified version of the input signal. As shown in FIG. 2, the current limiting techniques and systems of the present invention should be strategically placed in a circuit. For example, if the current carrying capacity of stage 36 is much greater than the current carrying capacity of stage 34, the source resistance transistor 32 should be placed between ground potential and stage 36 as opposed to between ground potential and stage 34. Alternatively, the current limiting transistor may be placed based on the probability of gate input being high or low, or on the known state of an input in standby. For example, it is known that the IN signal in FIG. 2 is usually low or that it is low in standby, then it might be preferable to have the source resistance transistor connected to the source of transistor 40 instead of to the source of transistor 44. A source resistance transistor in the source of transistor 42 might also be appropriate. Having a source resistance transistor connected to the source of transistor 40 will tend to increase the leakage in transistor 44 since it will raise the low input to transistor 44. In some cases, it would be beneficial to have source resistance transistors connected to both the source of transistor 40 and transistor 44.

In circuit 30, the effective threshold voltage of transistor 44 can be adjusted through the operation of transistor 32. If the inherent threshold voltage of transistor 44 is high enough to prevent an unacceptable amount of leakage current in stage 36, the gate of transistor 32 can be connected to the $V_{DD}$ supply voltage by connecting bond pad 46 to bond pad 48. If, however, the threshold voltage of transistor 44 is too low and stage 36 has a corresponding amount of unacceptable leakage current, the gate of transistor 32 can be connected to ground potential by connecting bond pad 46 to bond pad 50. This will increase the voltage drop across transistor 32, raising the voltage on the source of transistor 44. Transistor 32 may comprise an accumulation mode transistor so that it provides a sufficient amount of current even when its low current mode is selected. Alternatively, an intermediate voltage may be used to select the low current mode or a parallel current path may be provided.

The connection of bond pad 46 to either bond pad 48 or bond pad 50 may be accomplished through a photolithographically formed conductive layer, through packaging, through on-chip logic or through connections outside of the system according to the methods and techniques described in detail with reference to FIG. 1 previously.

Figure 3:
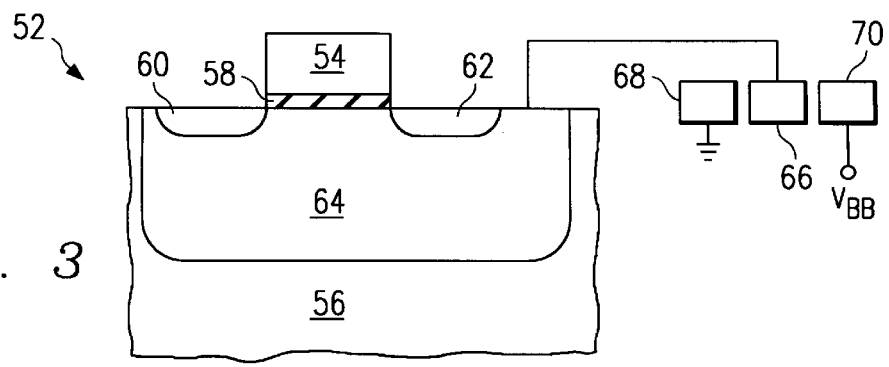
FIG. 3 is a cross-sectional elevational diagram of a transistor constructed using the techniques of the present invention.

Circuits 10 and 30 discussed with reference to FIGS. 1 and 2 respectively accomplish threshold voltage adjustments using source resistance transistors. The threshold voltage of a particular device can also be adjusted directly by adjusting voltages of structures within the devices itself. Referring to FIG. 3, a transistor indicated generally at 52 is illustrated. Transistor 52 comprises a gate conductor 54 which is separated from the outer surface of substrate 56 by gate oxide 58. Transistor 52 also comprises a source region 60 and a drain region 62. Transistor 52 is constructed in a doped tank region 64 within substrate 56. Tank region 64 is electrically connected to a bond pad 66. A bond pad 68 is connected to ground potential and a bond pad 70 is connected to a $V_{BB}$ supply voltage. The $V_{BB}$ supply voltage may comprise a negative backgate bias voltage of, for example, on the order of −1 volt. Bond pad 66 and as a result, tank region 64 can be electrically connected to bond pad 68 or bond pad 70 using the techniques described previously. In this manner, the threshold voltage of transistor 52 can be adjusted by setting the voltage of tank region 64 at either ground potential or at the voltage of the $V_{BB}$ supply voltage.

Figure 4:
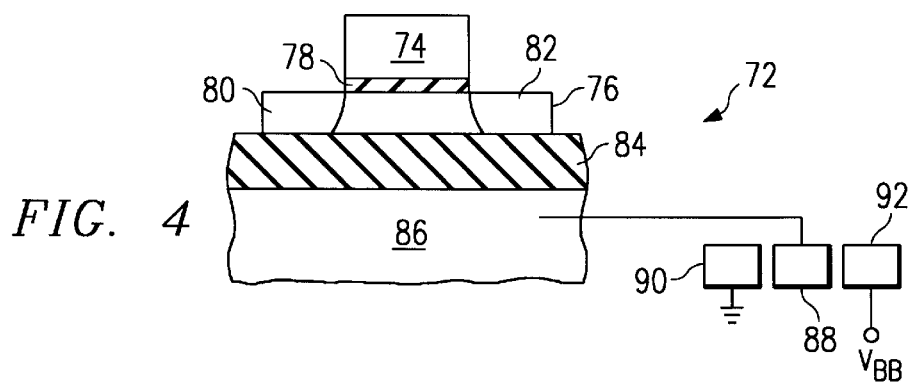
FIG. 4 is a cross-sectional elevational diagram of a transistor constructed using the techniques of the present invention.

FIG. 4 illustrates a transistor 72 that comprises a gate conductor 74 that is separated from a semiconductor layer 76 by gate oxide 78. Semiconductor layer 76 comprises a source region 80 and a drain region 82. Semiconductor layer 76 is disposed outwardly from an insulator layer 84. Insulator layer 84 is disposed outwardly from a semiconductor substrate layer 86. The substrate layer 86 is connected to a bond pad 88. Ground potential is connected to a bond pad 90 and the $V_{BB}$ supply voltage is connected to a bond pad 92. Using the techniques discussed previously, the bond pad 88 and as a result the substrate 86 can be electrically connected to either ground potential or the $V_{BB}$ supply voltage through bond pad 90 or bond pad 92, respectively. By changing the voltage of substrate 86, the threshold voltage of transistor 72 can be adjusted. Transistor 72 comprises a typical silicon on insulator device, where layer 76 is thin enough so that transistor 72 can run in a fully depleted mode of operation. If transistor 72 runs in a fully depleted mode of operation, the voltage on substrate 86 can dramatically affect the threshold voltage of transistor 72 depending upon the thickness of oxide layer 84. Well-like structures can be formed in layer 76 so that different backgate voltages can be applied to different devices within a single integrated circuit.

Figure 5:
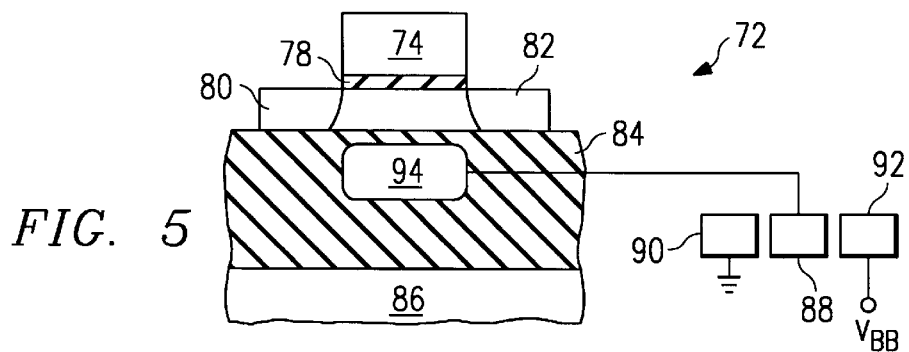
FIG. 5 is a cross-sectional elevational diagram of a transistor constructed using the techniques of the present invention.

FIG. 5 illustrates an alternate embodiment of transistor 72 that includes a buried semiconductor region 94 disposed proximate the channel region of transistor 72. In silicon on insulator architectures, a semiconductor region such as region 94 can be used as a back-gate to transistor devices such as transistor 72. Semiconductor region 94 is much closer to the channel of transistor 72 than substrate 86 and as such, the voltage on the region 94 can have a much greater impact on the threshold voltage of transistor 72. The voltage on region 94 can be adjusted by connecting bond pad 88 to either bond pad 90 or 92 using the techniques discussed previously.

Figure 6:
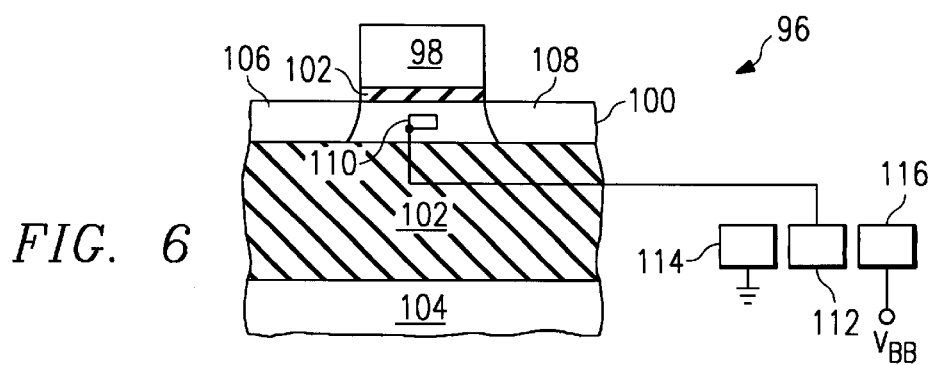
FIG. 6 is a cross-sectional elevational diagram of a transistor constructed using the techniques of the present invention.

FIG. 6 illustrates a transistor indicated generally at 96 which is also a silicon on insulator device. Transistor 96 comprises a gate-conductor 98 which is separated from a semiconductor layer 100 by a gate oxide 102. Semiconductor layer 100 is disposed outwardly from an insulator layer 102. Insulator layer 102 is disposed outwardly from a semiconductor substrate 104. Semiconductor 100 comprises a source region 106 and a drain region 108. Transistor 96 may operate in fully depleted mode or the thickness of 100 may dictate that transistor 96 operate in less than a fully depleted mode. In either case, a body contact 110 can be electrically connected to a bond pad 112. A bond pad 114 is connected to ground potential and a bond pad 116 is connected to the $V_{DD}$ supply voltage. Body contact 110 can be made in a region of layer 100 that is not disposed inwardly from gate conductor 98. For example, layer 100 could include an extension that could be used to facilitate body contact 110. The voltage of the region of semiconductor layer 100 proximate the channel of transistor 96 can be adjusted by connecting bond pad 112 to either bond pad 114 or bond pad 116 using the techniques described previously. The voltage of the body contact 110 will have a dramatic influence on the threshold voltage of transistor 96.

Figure 7:
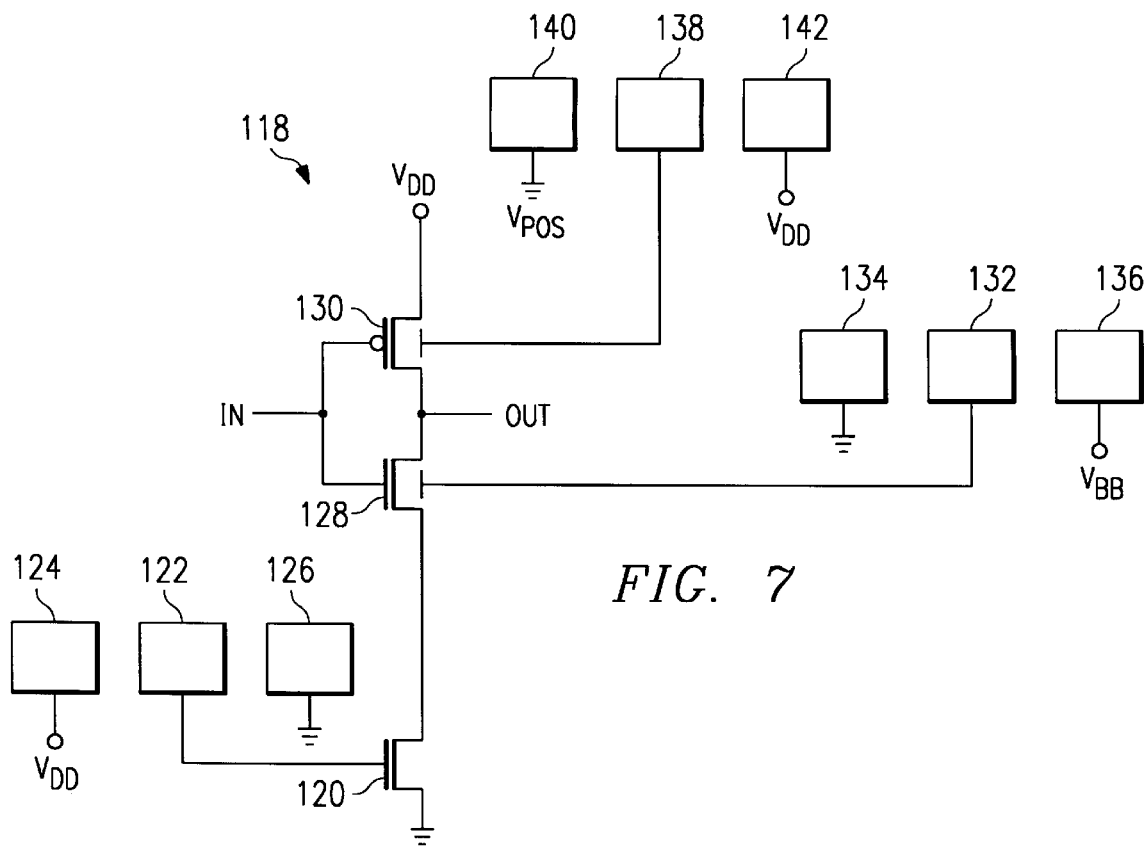
FIG. 7 is a schematic illustration of an integrated circuit constructed using systems and techniques of the present invention.

FIG. 7 illustrates a circuit, indicated generally at 118, that illustrates how the various techniques described herein can be combined to adjust the threshold voltages of different elements within a single circuit. Circuit 118 comprises an n-channel source resistance transistor 120 that has its source connected to ground potential and its gate connected to a bond pad 122. A bond pad 124 is connected to the $V_{DD}$ supply voltage and a bond pad 126 is connected to ground potential. The drain of transistor 120 is connected to the source of an n-channel transistor 128. The gate of n-channel transistor 128 is connected to an input voltage. The drain of transistor 128 provides an output voltage and is connected to the drain of a p-channel transistor 130. The gate of transistor 130 is connected to the input voltage. The source of p-channel transistor 130 is connected to the $V_{DD}$ supply voltage. A back-gate body connection or substrate connection of transistor 128 is connected to a bond pad 132. A bond pad 134 is connected to ground potential while a bond pad 136 is connected to the $V_{BB}$ supply voltage. A similar back-gate body or substrate connection associated transistor 130 is connected to a bond pad 138. A bond pad 140 is connected to a supply voltage $V_{POS}$ that is more positive than $V_{DD}$ while a bond pad 142 is connected to the $V_{DD}$ supply voltage. The threshold voltage of transistor 130 can be directly controlled by connecting bond pad 138 to either bond pad 140 or 142. The threshold voltage of transistor 128 can be directly controlled by connecting bond pad 132 to either bond pad 134 or bond pad 136. The threshold voltage of transistor 128 can be indirectly controlled by connecting the gate of source resistance transistor 120 to either the $V_{DD}$ supply voltage or ground potential by connecting bond pad 122 to bond pad 124 or bond pad 126, respectively. The connections described can be accomplished using the techniques described previously. The circuit elements within circuit 118 can all be adjusted independently or together. For example, under some circumstances, process variations may require the threshold voltages of all elements within the system to be adjusted in the same direction. In this manner, all of the back-gate connections could be connected to the same potential. Alternatively, various parts of the circuit may require different adjustments because process variations may have resulted in unduly large leakage currents in some types of devices but not in others.

Figure 8:
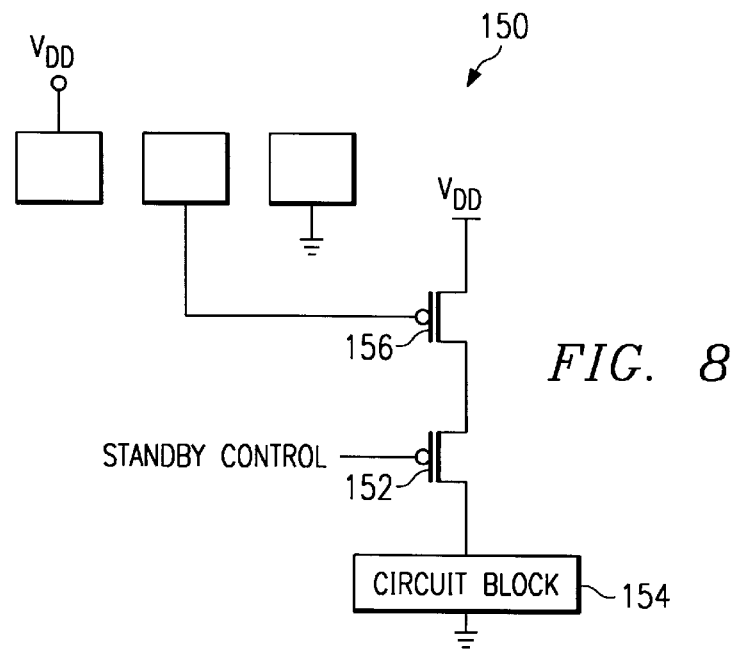
FIG. 8 is a schematic illustration of an integrated circuit constructed using an additional embodiment of this invention.

An additional embodiment of the present invention is shown in FIG. 8 which illustrates a circuit, indicated generally at 150. One way to reduce standby power in an integrated circuit is to include a transistor such as p-channel transistor 152 in series between a circuit block 154 and a voltage supply such as the $V_{DD}$ supply voltage, with that transistor gated by a Standby Control signal. The transistor 152 is placed in its low conductance mode in standby to reduce leakage current to the circuit block 154 during standby. The transistor 152 is placed in a high conductance state during active mode to supply current to the circuit block 154. In this approach to reducing standby current, there is a trade off involving the threshold voltage of the transistor 152, the width of the transistor 152, the amount of standby current even with the transistor "off," and the impact on performance. The lower the threshold voltage and the wider the transistor 152, the lower the impact on performance but the greater the leakage. Also, the wider the transistor 152, the greater the active power required to switch the transistor from "on" to "off." The present invention can be applied to the circuit 150 by including a source resistance transistor 156 in series with the source of the standby control transistor 152, as illustrated in FIG. 8. The source resistance transistor 156 can be an accumulation mode transistor, or can be connected in parallel with a parallel current source such as a resistor, diode, or other transistor. Transistor 156 can be controlled, as described previously, by connecting its gate to a suitable supply voltage using the techniques described previously.

In addition, as discussed previously, the connections described can be used to provide for different modes of operation for a single circuit. In this embodiment, various circuit blocks may be allowed to enter a higher performance, higher power mode of operation while other circuit blocks may need to remain limited in their power use.

While the exemplary circuits shown in the figures described herein illustrate provision for selective connection of control nodes to $V_{DD}$ or to ground through bond pads, it should be understood that connection of the control node to a selected supply voltage by other connection methods, such as through the use of on-chip interconnects or through the use of fuses such as for selection of redundancy circuitry are within the scope of the invention. Also, connection of the control node to the selected supply voltage through the package can also encompass other connection methods such as circuit board wiring and direct chip bonding. Further, while reference is made to $V_{DD}$ and ground, other supply voltages may be used, as available in the system.

The present invention provides a number of techniques that allow for the adjustment of the threshold voltage of current carrying devices within an integrated circuit. The threshold voltages can be directly adjusted by adjusting the back-gate, body contact, substrate contact or like contacts associated with the devices. By adjusting the voltages of layers, regions, and structures close to the channels of these devices, the threshold voltage of the devices can be altered. Alternatively, the threshold voltages of devices can be adjusted indirectly by adjusting the current carrying capability of source resistance transistors connected in series with the devices to be adjusted. These techniques can be used to correct for processing variances or to provide for dual modes of operation. For example, according to one embodiment of the present invention a single circuit could be used to operate with both a high voltage and a low voltage mode of operation. For example, the threshold voltages of the current carrying devices can be adjusted to work with a 2.5 volts supply voltage using the techniques of the present invention. The same circuit could also use a 1 volt supply voltage by placing the device in an alternate mode of operation using the adjustments provided by the systems of the present invention.

Although the present invention has been described in detail, it should be understood that various changes, alterations, modification, and substitutions made be made to the teachings described herein without the departing from the spirit and scope of the present invention which is fully defined by the dependent claims.

What is claimed is:

1. A method of controlling leakage current within an integrated circuit comprising the steps of:

determining whether a current carrying device within the integrated circuit is susceptible to exhibiting an unacceptable level of leakage current;

responsive to said determination, adjusting the threshold voltage of the current carrying device to reduce the current carrying capacity of the device if the device is susceptible to exhibiting an unacceptable amount of leakage current by reducing the current carrying capability of a source resistance transistor connected in series with the current carrying device by connecting a control gate of the source resistance transistor to a first predetermined voltage level; and connecting the control gate of the source resistance transistor to a second predetermined voltage level to allow the source resistance transistor to conduct a full measure of current if the current carrying device is not susceptible to exhibiting an unacceptable level of leakage current.

2. An electronic circuit comprising:

a source resistance transistor connected to a first supply voltage;

a current carrying transistor connected between the source resistance transistor and a second supply voltage; and a control gate of the source resistance transistor connected to a bond pad that is electrically connectable to either the first or second supply voltages, the connection of the control gate of the source resistance transistor to the first supply voltage resulting in a reduction of the current carrying capacity of the source resistance transistor and a corresponding increase in the threshold voltage of the current carrying transistor thereby reducing the leakage current through the current carrying transistor, whereby the current carrying transistor continues to function at a somewhat reduced capacity.

3. The circuit of claim 2 wherein the control gate of the source resistance transistor is connected to the second supply voltage such that the source resistance transistor is able to conduct current at full capacity and the threshold voltage of the current carrying transistor is left substantially unchanged.

4. The circuit of claim 2 wherein the connection of the control gate of the source resistance transistor is made by a conductive layer defined by photolithographic mask used during the creation of the circuit.

5. The circuit of claim 2 wherein the connection of the control gate of the source resistance transistor is made by connecting bond pads respectively connected to the first supply voltage and to the control gate at the time the semiconductor die on which the circuit is disposed is bonded to a package frame.

6. The circuit of claim 2 wherein the connection is made within a package in which the die on which the circuit is disposed is placed.

7. The circuit of claim 2 wherein the control gate and the first and second supply voltages are each separately connected to a pin of a package containing the circuit and wherein the connection of control gate to either the first or second supply voltages are made by systems external to the package containing the circuit.

* * * * *